United States Patent [19]

Jerome et al.

[11] Patent Number: 5,420,050

[45] Date of Patent: May 30, 1995

[54] METHOD OF ENHANCING THE CURRENT GAIN OF BIPOLAR JUNCTION TRANSISTORS

[75] Inventors: Rick C. Jerome, Monument; Ian R. C. Post; Gary M. Wodek, both of Colorado Springs, all of Colo.

[73] Assignee: United Technologies Corporation, Hartford, Conn.

[21] Appl. No.: 170,542

[22] Filed: Dec. 20, 1993

[51] Int. Cl.⁶ .......................................... H01L 21/331
[52] U.S. Cl. ....................................... 437/31; 437/162; 437/46; 148/DIG. 124
[58] Field of Search ............... 437/31, 24, 25, 162, 437/20, 27, 909, 977, 46

[56] References Cited

U.S. PATENT DOCUMENTS

| | | | |
|---|---|---|---|
| 4,755,487 | 7/1988 | Scovell et al. | 437/31 |
| 5,096,840 | 3/1992 | Bean et al. | 437/24 |
| 5,194,397 | 3/1993 | Cook et al. | 148/DIG. 124 |
| 5,238,849 | 8/1993 | Sato | 148/DIG. 124 |
| 5,296,388 | 3/1994 | Kameyama et al. | 437/162 |

*Primary Examiner*—Brian H. Hearn
*Assistant Examiner*—Tuan Nguyen
*Attorney, Agent, or Firm*—Ozer M. N. Teitelbaum

[57] ABSTRACT

The present invention teaches a method and structure of enhancing the current gain characteristics of a bipolar junction transistor. The method comprises the step of forming a patterned silicon dioxide layer superjacent a semiconductor substrate comprising a base, an emitter and a collector, such that a carrier current conducts between the base and the emitter. The silicon dioxide layer forms an interface on the substrate at the emitter. Further, a first polysilicon layer is formed superjacent both the patterned silicon dioxide layer and the interface, and is implanted with $O_2$. Subsequently, the substrate is heated such that the emitter interface is obstructed by a silicon dioxide formation, thereby blocking a portion of carrier current from passing through the interface.

20 Claims, 2 Drawing Sheets

METHOD OF ENHANCING THE CURRENT GAIN OF BIPOLAR JUNCTION TRANSISTORS

TECHNICAL FIELD

This invention relates to the field of semiconductor devices, and more particularly bipolar junction transistors.

BACKGROUND ART

In the semiconductor industry, bipolar junction transistors ("BJT") are known and used in either amplifying or switching devices. When employed in the former device, a BJT typically amplifies a small alternating current ("AC") signal according to the BJT's current gain characteristics.

BJTs essentially comprise three doped active regions—an emitter, a base and a collector region. These regions form a first diode between the base and emitter and a second diode between the base and collector. Each diode junction can be forward or reversed biased depending on the external voltage applied thereto. Thus, the BJT is termed "forward active" when the emitter base junction diode is forward biased, while the collector base junction diode is reversed biased.

It has been observed that each active region has an associated current—$I_e$, $I_b$, and $I_c$. Of these currents, with respect to an PNP-type device, $I_b$ is a minority carrier current involving the flow of electrons, while both $I_e$ and $I_c$ are majority carrier currents which pertain to the flow of holes. Similarly, in an NPN-type device, $I_b$ is a majority carrier current and both $I_e$ and $I_c$ are minority carrier currents. Further, the total emitter current comprises the sum of the total number of electrons reaching the collector and the total number of electrons that flow out of the transistor through the base. This can be expressed in mathematical terms by the following equation:

$$I_e = I_b + I_c.$$

Further, the current gain relationship between $I_c$ and $I_b$ can be quantified by the following formula:

$$\beta = I_c/I_b.$$

Thus, given these relationships, the extent of minority carrier flow directly relates to the value of the current gain.

Traditionally, the values of $\beta$ have provided a current gain in the range of 100 to 300. Factors, such as the doped conductivity configuration of the BJT, the degree of doping, and reliability of the device itself, all impact on the current gain's value. Therefore, a need exists for a method and structure for enhancing the current gain of BJTs, without effecting the dopant concentration of the overall device or its reliability.

DISCLOSURE OF THE INVENTION

The primary advantage of the present invention is to provide a method and structure for enhancing the current gain of a bipolar junction transistor.

Another advantage of the present invention is to provide a method and structure for enhancing the current gain of a bipolar junction transistor without effecting the dopant concentration of the overall BJT.

Still a further advantage of the present invention is to provide a method and structure for enhancing the current gain of a bipolar junction transistor which has no impact on the reliability of the BJT device.

Yet another advantage of the present invention is to provide a method and structure for enhancing the current gain of a high voltage linear bipolar junction transistor which improves process uniformity and control.

In order to achieve the advantages of the present invention, in one embodiment of the present invention, a method of enhancing the current gain of bipolar junction transistors is disclosed. Here, the method comprises several steps including the formation of a patterned silicon dioxide layer superjacent a semiconductor substrate having a base, an emitter and a collector such that a carrier current conducts between the base and the emitter. The patterned silicon dioxide layer exposes an interface on the substrate at the emitter. Further, a first polysilicon layer is formed superjacent both the patterned silicon dioxide layer and the interface and is implanted with $O_2$. Subsequently, the substrate is heated such that the emitter interface is obstructed by a silicon dioxide formation, thereby blocking a portion of the carrier current from passing through the interface. Once the silicon dioxide formation is completed, a polysilicon contact is formed for the emitter, base and collector.

In a further embodiment of the present invention, a patterned silicon dioxide layer is formed superjacent a semiconductor substrate having a base, an emitter and a collector, such that a carrier current conducts between the base and the emitter. The emitter is implanted with a dose of a first dopant comprising at least one of B, Al, Ga, In and Tl. The patterned silicon dioxide layer exposes an interface on the substrate at the emitter. Further, a first polysilicon layer is formed superjacent both the patterned silicon dioxide layer and the interface and is implanted with a dose of a second dopant comprising a at least one of N, P, As, Sb, and Bi, while maintaining the predetermined doped conductivity configuration of the BJT. Subsequently, the substrate is heated, such that the second dopant diffuses through the first polysilicon layer to reside at the emitter interface, thereby blocking a portion of the carrier current from passing through the interface. Once the silicon dioxide formation is completed, a polysilicon contact is formed for the emitter, base and collector.

In a further embodiment, a patterned silicon dioxide layer is formed superjacent an atomically cleaned semiconductor substrate having a base, an emitter and a collector such that a carrier current conducts between the base and the emitter. The patterned silicon dioxide layer exposes an interface on the substrate at the emitter. Subsequently, a silicon dioxide obstruction is formed at the interface, thereby blocking a portion of the carrier current from passing through the interface. Once the obstruction is completed, a polysilicon contact is formed for the emitter, base and collector.

In a further embodiment of the present invention, a semiconductor substrate comprising a base, an emitter, and a collector is provided such that a carrier current conducts between the base and the emitter. The surface of the substrate is then atomically cleaned and a silicon dioxide layer is formed superjacent the semiconductor substrate. Subsequently, the emitter interface is roughened while patterning the silicon dioxide layer, thereby blocking a portion of the carrier current from passing through the interface.

In a further embodiment, a bipolar junction transistor is disclosed having enhanced current gain characteristics. Here, the BJT comprises a semiconductor substrate having three interfaces; an emitter interface, a base interface, and a collector interface. The emitter, base, and collector are each implanted with a dopant, such that a minority carrier current conducts between the base and the emitter. Further, formed superjacent the substrate is a patterned silicon dioxide layer. The silicon dioxide layer is patterned such that three contact areas are formed. Each contact enables access to one interface of the emitter, base and collector interfaces. This access is achieved by a polysilicon contact formed in each contact area. Moreover, means are incorporated for blocking a portion of the minority carriers from passing through the emitter interface and thus increasing the current gain. This increase in the current gain is supported by the mathematical relationship represented by the formula $\beta = I_c$ (Majority Carrier Current for PNP, and Minority Carrier Current for NPN)/$I_b$ (Minority Carrier Current for PNP, and Majority Carrier Current for NPN).

Other aspects and advantages will become apparent to those skilled in the art from the following detailed description read in conjunction with the appended claims and the drawings attached hereto.

BRIEF DESCRIPTION OF THE DRAWINGS

The present invention will be better understood from reading the following description of non-limited embodiments, with reference to the attached drawings, wherein below.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
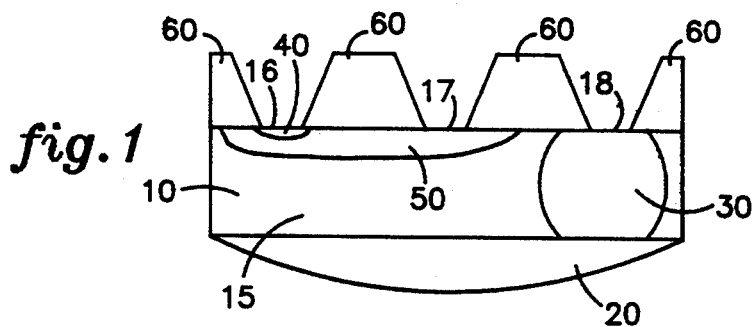
FIG. 1 illustrates a semiconductor structure formed according to a first step of a first embodiment of the present invention.

Referring to FIG. 1, a semiconductor structure is depicted according to a first step of the first embodiment of the present invention. As shown, a semiconductor substrate 10 comprises various dopant regions for the proper operation of a bipolar junction transistor ("BJT"). The particular dopants employed for there regions are dependent on the conductivity type—PNP or NPN—of the intended BJT. For the purposes of illustration, the BJT described hereinbelow will have, though not limited to, a PNP type Conductivity configuration.

Given the BJT's conductivity type, substrate 10 comprises a P− well 15 having a depth of approximately 2.0 μm and a P+ buried layer 20. Formed within P− well 15 is an N− base 50 having a junction depth of approximately 0.3 μm. N− base 50 extends over both a first and second interface, 16 and 17, at the upper surface of substrate 10. Additionally, a P+ region 40 is formed within N− base 50. Substrate 10 further comprises a third interface 18, which is coupled with P+ buried layer 20 by means of a P+ sink deep diffusion region 30 having a depth of approximately 3.0 μm.

Upon completion of the fabrication of the device, first interface 16 ultimately represents an emitter, second interface 17 a base, and third interface 18 a collector. It should be noted that by this arrangement, a minority carrier current will conduct from the base and the emitter through N− base 50. Similarly, majority carrier currents are conducted from the emitter to the collector. The majority carrier current takes a path from P+ emitter region 40 through N− base 50, P− well 15, P+ buried layer 20 and P+ sink 30.

Formed superjacent substrate 10 is a patterned silicon dioxide layer 60 having a thickness of approximately 0.1 μm. In achieving this patterned configuration, an initial substantially uniform silicon dioxide layer is first formed superjacent substrate 10 by various techniques known in the art, including plasma enhanced chemical vapor deposition ("PECVD"). In an alternate embodiment, the surface of substrate 10 is atomically cleaned prior to forming the initial silicon dioxide layer.

Once formed, a layer of photoresist is then deposited superjacent the initial silicon dioxide layer according to a predetermined pattern. This pattern is such that the regions ultimately forming interfaces 16–18 are left uncovered by the photoresist. With the pattern of photoresist developed, those silicon dioxide surface areas not covered by the photoresist are then etched. Thus, the areas covered by the photoresist remain intact, and the remaining photoresist layer is removed. By employing the hereinabove steps, the patterned silicon dioxide layer 60 comprises three contacts, each for accessing a particular interface.

Figure 2:
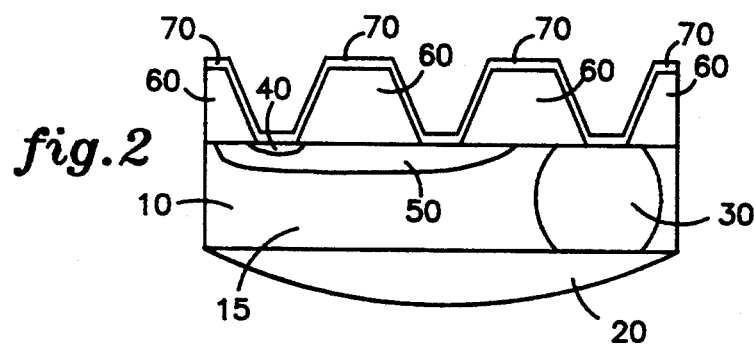
FIG. 2 illustrates a semiconductor structure formed according to a second step of the first embodiment of the present invention.

Referring to FIG. 2, a semiconductor structure is depicted according to a second step of the first embodiment. Here, a first polysilicon layer 70 is formed superjacent the resultant structure of FIG. 1, which includes patterned silicon dioxide layer 60 and interfaces 16–18. First polysilicon layer 70 is incorporated for the purpose of fabricating a polysilicon BJT, and comprises a thickness of approximately 500 Å. First polysilicon layer 70 can be formed by low pressure chemical vapor deposition ("LPCVD").

Figure 3:
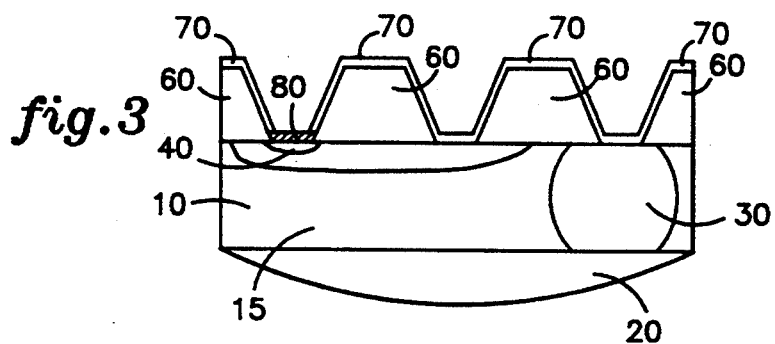
FIG. 3 illustrates a semiconductor structure formed according to a third step of the first embodiment of the present invention.

Referring to FIG. 3, a semiconductor structure is depicted according to a third step of the first embodiment. Upon completing the structure of FIG. 2, first polysilicon layer 70 in the area covering the first interface 16 is implanted with $O_2$. The implant associated with this step comprises a dose substantially in the range of $1 \times 10^{10}$ oxygen ions/cm$^2$ to $1 \times 10^{12}$ oxygen ions/cm$^2$.

Subsequently, substrate 10 is heated. This heating step enables the $O_2$ implant to create an obstruction 80 at the first interface 16. This obstruction 80, comprised of a silicon dioxide formation and having a thickness substantially in the range of 10 Å to 50 Å within 200 Å of the interface, provides a means for blocking a portion of the minority carriers from passing through the emitter interface. This heating step causes the oxide to form clusters and "ball up" to provide this blocking mechanism. As such, the current gain of the polysilicon device is substantially increased. This is Supported by the mathematical relationship represented in the formula $\beta = I_c$ (Majority carrier current)/$I_b$ (Minority carrier current).

Figure 4:
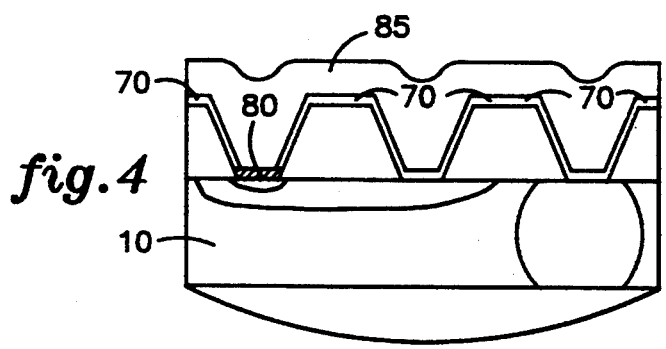
FIG. 4 illustrates a semiconductor structure formed according to a fourth step of the first embodiment of the present invention.

Referring to FIG. 4, a third step of the first embodiment is shown. Here, a second polysilicon layer 85 is formed superjacent first polysilicon layer 70. Second polysilicon layer 85, having a thickness substantially in the range of 0.2 μm to 0.5 μm, is substantially thicker than first polysilicon layer 70. Second polysilicon layer 85 can be formed by LPCVD techniques.

Figure 5:
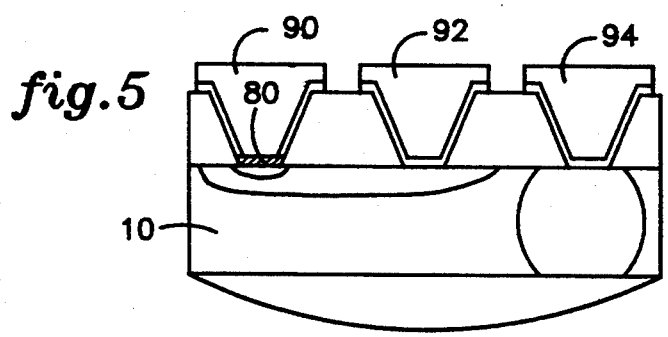
FIG. 5 illustrates a semiconductor structure formed according to a fifth step of the first embodiment of the present invention.

Referring to FIG. 5, a fourth step is illustrated of the first embodiment. Subsequent to the formation of second polysilicon layer 85, both first and second polysilicon layers are patterned to complete an electrical contact to each interface. This is achieved by depositing a layer of photoresist superjacent the upper surface of the second polysilicon layer 85 according to a predetermined pattern. This pattern is such the regions separating the emitter, base and collector contacts, 90, 92 and 94, respectively, are left uncovered by the photoresist. With the pattern of photoresist developed, those areas not covered by the photoresist are then etched. Thus, the areas covered by the photoresist remain intact, and the remaining photoresist layer is removed. By employing the hereinabove steps, emitter, base and collector contacts, 90, 92 and 94 are formed.

Figure 6:
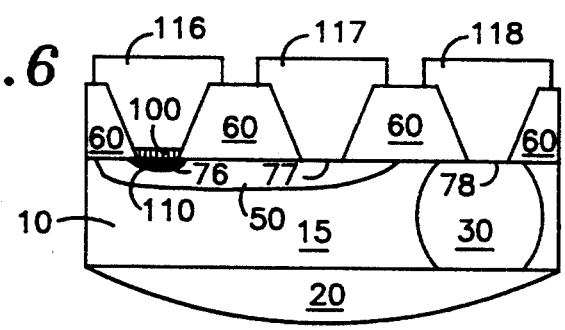
FIG. 6 illustrates a resultant semiconductor structure formed according to a second embodiment of the present invention.

Referring to FIG. 6, a resultant semiconductor structure formed according to a second embodiment of the present invention is illustrated. Here, the BJT is preferably an PNP transistor type. Given the BJT's conductivity type, as disclosed hereinabove, semiconductor substrate 10 comprises a P$^-$ well 15, a P$^+$ buried layer 20, and an N$^-$ base 50 formed within P$^-$ well 15. N$^-$ base 50 extends over both the first (emitter) and second (base) interfaces, 76 and 77, at the upper surface of substrate 10.

Substrate 10 further comprises a P$^+$ sink deep diffusion region 30 which provides a conductive path between the third interface (collector) 78, P$^+$ buried layer 20, N$^-$ base 50 and a P$^+$ emitter region 110. P$^+$ emitter region 110 is formed within N$^-$ base 50. P$^+$ emitter region 110 is implanted with a dose of a first dopant comprising at least one of B, Al, Ga, In and Tl preferably boron. In one embodiment of the present invention, the dose of the first dopant implant is substantially in the range of $1 \times 10^{15}$ ions/cm$^2$ to $8 \times 10^{15}$ ions/cm$^2$.

As noted hereinabove, a minority carrier current will conduct between the base and the emitter through N$^-$ base 50 to the P$^+$ emitter region 110. Similarly, a majority carrier current is conducted from the emitter to the collector. The majority carrier current takes a path from P$^+$ emitter 110 through N$^-$ base well 50, P$^-$ well 15, P$^+$ buried layer 20, and P$^+$ sink diffusion region 30.

Formed superjacent substrate 10 is a patterned silicon dioxide layer 60. Layer 60 is patterned according to the methodology disclosed hereinabove. In one embodiment of the present invention, the surface of substrate 10 is atomically cleaned prior to forming the patterned silicon dioxide layer. By employing the appropriate pattern, the patterned silicon dioxide layer 60 comprises three contacts, each for accessing a particular interface, 76–78.

Subsequent to the formation of the patterned silicon dioxide layer 60, a polysilicon layer is formed superjacent the dioxide layer 60 and interfaces, 76–78. The polysilicon layer is incorporated for the purpose of fabricating a polysilicon BJT, and comprises a thickness substantially in the range of 0.2 μm to 0.5 μm. The polysilicon layer can be formed by several techniques, including LPCVD.

Upon its formation, the polysilicon layer, in the area covering the first interface 76, is implanted with a dose of a second dopant. The second dopant comprises at least one of N, P, As, Sb, and Bi, preferably arsenic, and thus is an electron donor within a P$^+$ acceptor region 110. In one embodiment of the present invention, the implant associated with this step comprises a dose of approximately $1 \times 10^{12}$ ions/cm$^2$. Given the dosages of both first and second dopants, the predetermined doped conductivity configuration of the BJT can be maintained.

Subsequently, substrate 10 is heated. This heating step enables the implant comprising at least one of N, P, As, Sb, and Bi to diffuse through the polysilicon layer until it reaches the first interface 76. At interface 76, the implant comprising at least one of N, P, As, Sb, and Bi stops diffusing and becomes a permanent obstruction 100. By this arrangement, a means for blocking a portion of the minority carriers from passing through the emitter interface is provided. This is due to arsenic's tendency to cluster at the interface. As such, the current gain of the polysilicon device is substantially increased. This is supported by the mathematical relationship represented in the formula $\beta = I_c$ (Majority Carrier Current)/$I_b$ (Minority Carrier Current).

Once obstruction 100 is formed at interface 76, polysilicon contacts, 116, 117 and 118, are formed for the emitter, base and collector. This is accomplished by the steps disclosed hereinabove, which include patterning the polysilicon layer to complete an electrical contact for each interface. This is achieved by the steps of depositing a photoresist layer having a predetermined pattern, etching those areas not covered by the photoresist, and then removing the remaining photoresist.

Figure 7:
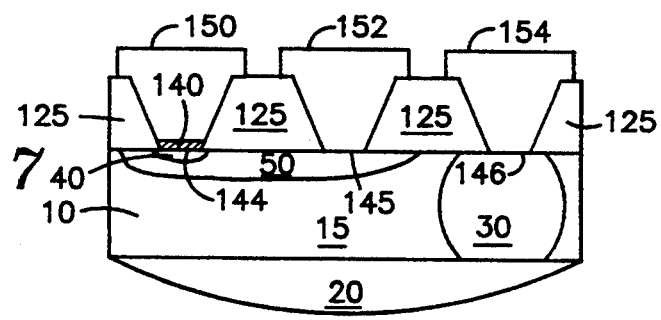
FIG. 7 illustrates a resultant semiconductor structure formed according to a third embodiment of the present invention.

FIG. 7 illustrates a resultant semiconductor structure formed according to a third embodiment of the present invention. Given the BJT's conductivity type, substrate 10 comprises a P$^-$ well 15 having a diffusion depth of approximately 2.0 μm and a P$^+$ buried layer 20. Formed within P$^-$ well 15 is an N$^-$ base 50 having a junction depth of approximately 0.3 μm. N$^-$ base 50 extends over both a first and second interface, 144 and 145, at the upper surface of substrate 10. Additionally, a P$^+$ emitter region 40 is formed within N$^-$ base well 50. Substrate 10 further comprises a third interface 146, which is coupled with P$^+$ buried layer 20 by means of a P$^+$ sink deep diffusion region 30 having a diffusion depth of approximately 3 μm.

Upon completion of the fabrication of the device, first interface 144 ultimately represents an emitter, second interface 145 represents a base, and third interface 146 represents a collector. It should be noted that by this arrangement, a minority carrier current will conduct between the base and the emitter through N⁻ base 50. Similarly, majority carrier currents are conducted from the emitter to the collector. The current takes a path from P+ emitter region 40 through N⁻ base 50, P⁻ well 15, P+ buried layer 20 and P+ sink deep diffusion region 30.

Formed superjacent substrate 10 is a patterned silicon dioxide layer 125. Layer 125 is patterned according to the methodology disclosed hereinabove. By employing the appropriate pattern, the patterned silicon dioxide layer 125 comprises three contact areas, each for accessing a particular interface, 144-146. Further, in the present embodiment, the surface of substrate 10 is atomically cleaned prior to forming the patterned silicon dioxide layer 125. This is achieved by introducing a HF solution, preferably comprising 10 parts water and 1 part HF, to the surface, and more particularly the emitter interface 144.

Subsequent to cleaning the substrate and forming the patterned silicon dioxide layer 125, a silicon dioxide obstruction 140 is formed at the first interface 144. Obstruction 140 provides a means for blocking a portion of the minority carriers from passing through the emitter interface 144. As such, the current gain of the polysilicon device is substantially increased. This is supported by the mathematical relationship represented in the formula $\beta = I_c$ (Majority Carrier Current)/$I_b$ (Minority Carrier current).

Silicon dioxide obstruction 140 can formed by several alternate approaches. In one technique, the cleaned emitter interface 144 is rinsed with boiling deionized water, which causes a chemical interaction to creates silicon dioxide obstruction 140. Here, a polysilicon contact is subsequently formed employing the techniques disclosed hereinabove. This is achieved by forming a polysilicon layer. Once formed, the polysilicon layer is patterned to form an emitter, base, and collector contact, 150, 152, and 154.

A second method for forming silicon dioxide obstruction 140 involves forming polysilicon layer superjacent patterned silicon dioxide layer 125 while introducing O₂. This introduction causes a chemical interaction which creates silicon dioxide obstruction 140. Once obstruction 140 is formed, a polysilicon contact for each interface is subsequently formed employing the techniques disclosed hereinabove. This is achieved by patterning the polysilicon layer to form an emitter, base, and collector contact, 150, 152, and 154.

Figure 8:
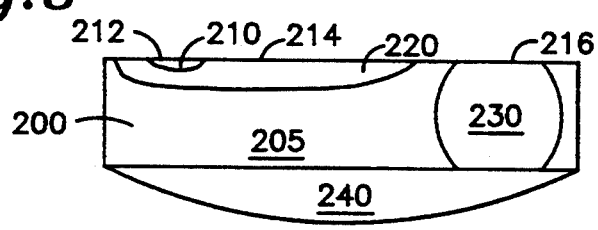
FIG. 8 illustrates a semiconductor structure formed according to a first step of a fourth embodiment of the present invention.

FIG. 8 illustrates a semiconductor structure formed according to a first step of a fourth embodiment of the present invention. Given the BJT's conductivity type, substrate 200 comprises a P⁻ well 205 having a diffusion depth of approximately 2.0 μm and a P+ buried layer 240. Formed within P⁻ well 205 is an N⁻ base 220 having a diffusion depth of approximately 0.3 μm. N⁻ base 220 extends over both a first and second interface, 212 and 214, at the upper surface of substrate 200. Additionally, a P+ emitter region 210 is formed within N⁻ base 220. Substrate 200 further comprises a third interface 216, which is coupled with P+ buried layer 240 by means of a P+ sink deep diffusion region 230 having a diffusion depth of approximately 3 μm.

Upon completion of the fabrication of the device, first interface 212 ultimately represents an emitter, second interface 214 represents a base, and third interface 216 represents a collector. It should be noted that by this arrangement, a minority carrier current will conduct between from the base and the emitter through N⁻ base 220. Similarly, the majority carrier current is conducted from the emitter to the collector. The majority carrier current takes a path from the P+ emitter region 210 through N⁻ base 220, P⁻ well 205, P+ buried layer 240 and P+ sink deep diffusion region 230.

Figure 9:
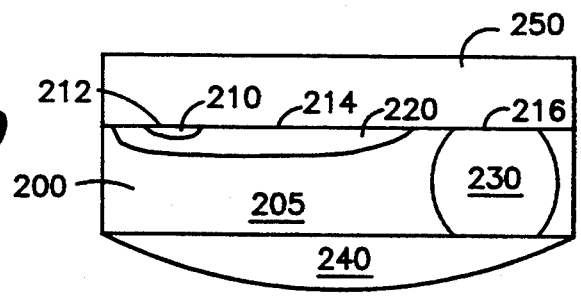
FIG. 9 illustrates a semiconductor structure formed according to a second step of the fourth embodiment of the present invention.

Referring to FIG. 9, a semiconductor structure formed according to a second step of the fourth embodiment of the present invention is illustrated. Here, a silicon dioxide layer 250 is formed superjacent an atomically cleaned substrate 200, including interfaces 212, 214 and 216. Silicon dioxide layer 250 is formed by various techniques known in the art, including PECVD.

Figure 10:
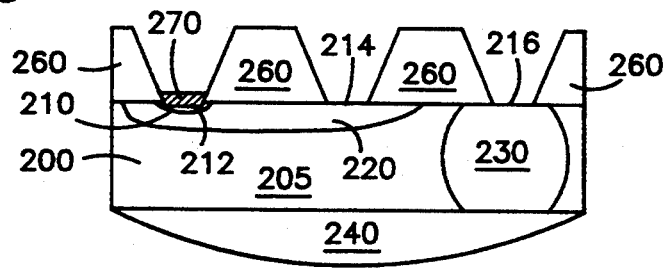
FIG. 10 illustrates a semiconductor structure formed according to a third step of the fourth embodiment of the present invention.

Referring to FIG. 10, illustrates a semiconductor structure formed according to a third step of the fourth embodiment of the present invention. Once silicon dioxide layer 250 is formed, it is then patterned to form patterned layer 260. While patterning layer 250, first (emitter) interface 212 is roughened. This can be accomplished simultaneously because the step of patterning itself comprises several steps. By roughening interface 212, a means are provided for blocking a portion of the minority carriers from passing through interface 212.

Thus, the step of roughening comprises several steps, which include initially forming a layer of photoresist superjacent silicon dioxide layer 250 according to a predetermined pattern. Subsequently, those surface areas not covered by photoresist are removed by means of an etching step, preferably a plasma dry etching step. A plasma dry etching step comprises introducing a dry etch chemical to the surface topography, which includes the silicon dioxide layer 250 and the layer of photoresist. The dry etch chemical is preferably selected from the group which includes CCl₄, CF₄, NF₃, SF₆, Cl₂, and CCl₂F₂. During the etching step, interface 212 is roughened and disrupted to enable the blocking of minority carriers. As, such, the epitaxial orientation of the polysilicon is minimized with respect to the substrate, and the current gain of the polysilicon device is substantially increased. This is supported by the mathematical relationship represented in-the formula $\beta = I_c$ (Majority Carrier Current)/$I_b$ (Minority Carrier Current).

Once properly etched, the remaining layer of photoresist is removed from the silicon dioxide layer 250. It should be noted that upon patterning silicon dioxide layer 250 and roughening interface 212, a polysilicon contact is formed for the emitter, base and collector.

In accordance with the embodiments disclosed hereinabove, a polysilicon BJT having an increased current gain can be fabricated. Such a BJT comprises a semiconductor substrate having three interfaces; an emitter interface, a base interface, and a collector interface. The emitter, base, and collector are each implanted with a dopant, such that a minority carrier current conducts between the base and the emitter when bias conditions are applied.

Furthermore, formed superjacent the substrate is a patterned silicon dioxide layer. The silicon dioxide layer is patterned such that three contact areas are formed. Each contact enables access to one interface of the emitter, base and collector interfaces. This access is achieved by a polysilicon contact formed in each contact.

Moreover, means are incorporated for blocking a portion of the minority carriers from passing through the emitter interface. This is supported by the mathematical relationship represented by the formula $\beta = I_c$ (Majority Carrier Current)/$I_b$ (Minority Carrier Current). It is this blocking phenomenon that enables a substantial increase in the current gain of the BJT.

This means for blocking can be realized by several different approaches. One such realization involves forming a silicon dioxide layer. This silicon dioxide layer is formed subjacent the polysilicon contact for the emitter. A second approach for realizing the means for blocking involves roughening the emitter interface. Employing either technique, the affected interface between the polysilicon emitter and the substrate, thus, decreases the mobility of the minority carriers and thereby lowers the concentration of minority carriers at the emitter ohmic contact.

A third technique for realizing the means for blocking, preferably applicable for PNP conductivity type BJTs, employs forming a polysilicon layer subjacent the polysilicon contact for the emitter, wherein the polysilicon layer is implanted with a dopant of at least one of N, P, As, Sb, and Bi. Adding a low doped arsenic implant to a PNP emitter enhances the blocking mechanism of the interface while retaining a PNP polarity. This is in contrast to the emitter dopant which comprises at least one of B, Al, Ga, In and Tl. It should be obvious to one of ordinary skill in the art that by reversing the dopant arrangement of the BJT, this method can also be used in NPN conductivity type BJTs.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. Thus, for example, the present invention is not limited to PNP and NPN devices, but is also applicable to both high and low voltage, as well as digital and linear BJTs. Further, the present invention is applicable to both conductivity types—PNP and NPN—of bipolar junction transistors. It is therefore contemplated that the appended claims will cover any such modifications or embodiments as fall within the true scope of the invention.

All of the U.S. Patents cited herein are hereby incorporated by reference as if set forth in their entirety.

What is claimed is:

1. A method of fabricating a bipolar junction transistor ("BJT"), comprising the steps of:
    forming a patterned silicon dioxide layer superjacent a semiconductor substrate having a base, an emitter and a collector to enable a carrier current to conduct between said base and said emitter, said patterned silicon dioxide layer exposing an interface on said substrate at said emitter;
    forming a first polysilicon layer superjacent said patterned silicon dioxide layer and said interface;
    implanting said first polysilicon layer with $O_2$; and
    heating said substrate such that said interface is obstructed by a silicon dioxide formation, thereby blocking a portion of said carrier current from passing through said interface.

2. The method of claim 1, further comprising the step of:
    forming a second polysilicon layer superjacent said implanted first polysilicon layer; and
    patterning said first and second polysilicon layers to form a base, a collector, and an emitter contact.

3. The method of claim 1, wherein said first polysilicon layer comprises a thickness of approximately 500 Å.

4. The method of claim 1, wherein said $O_2$ implant comprises a dose substantially in the range of $1 \times 10^{10}$ oxygen ions/cm$^2$ to $1 \times 10^{12}$ oxygen ions/cm$^2$.

5. The method of claim 1, wherein said semiconductor substrate is atomically cleaned prior to said forming a silicon dioxide layer.

6. The method of claim 1, wherein said silicon dioxide formation at said interface comprises a thickness substantially in the range of 10 Å to 50 Å, within approximately 200 Å of said interface.

7. A method of fabricating a bipolar junction transistor ("BJT") having a doped conductivity configuration, comprising the steps of:
    forming a patterned silicon dioxide layer superjacent a semiconductor substrate having a base, an emitter and a collector, to enable a carrier current to conduct between said base and said emitter, said emitter being implanted with a dose of a first dopant comprising at least one of B, Al, Ga, In and Tl, said patterned silicon dioxide layer exposing an interface on said substrate at said emitter; forming a polysilicon layer superjacent both said patterned silicon dioxide layer and said interface;
    implanting said polysilicon layer with a dose of a second dopant while maintaining said doped conductivity configuration of the BJT, said second dopant comprising at least one of N, P, As, Sb and Bi; and
    heating said substrate such that said second dopant diffuses through said polysilicon layer to reside at said interface, thereby blocking a portion of said carrier current from passing through said interface.

8. The method of claim 7, further comprising the step of:
    patterning said polysilicon layer to form a base, a collector, and an emitter contact.

9. The method of claim 7, wherein said polysilicon layer comprises a thickness of substantially in the range of 0.2 μm to 0.5 μm.

10. The method of claim 7, wherein said dose of said first dopant implant is substantially in the range of $1 \times 10^{15}$ ions/cm$^2$ to $8 \times 10^{15}$ ions/cm$^2$.

11. The method of claim 7, wherein said dose of said second dopant implant comprises approximately $1 \times 10^{12}$ ions/cm$^2$.

12. The method of claim 7, wherein said semiconductor substrate is atomically cleaned prior to said forming a patterned silicon dioxide layer.

13. A method of fabricating a bipolar junction transistor ("BJT") to increase current gain, comprising the steps of:
    forming a patterned silicon dioxide layer superjacent a semiconductor substrate having a base, an emitter and a collector to enable a carrier current to conduct between said base and said emitter, said patterned silicon dioxide layer exposing an interface on said substrate at said emitter;
    atomically cleaning said interface; and forming a silicon dioxide obstruction at said interface, thereby blocking a portion of said carrier current from passing through said interface, wherein said forming a silicon dioxide obstruction comprises the step of: rinsing said cleaned interface with substantially boiling deionized $H_2O$.

14. The method of claim 13, further comprising the step of:
forming a polysilicon contact superjacent said patterned silicon dioxide layer and said rinsed and cleaned interface.

15. The method of claim 13, wherein said atomically cleaning said interface comprises the step of exposing said interface to an HF solution.

16. The method of claim 13, wherein said forming a silicon dioxide obstruction comprises the step of:
forming a polysilicon layer superjacent said patterned silicon dioxide layer and said cleaned interface while introducing $O_2$, thereby blocking a portion of said carrier current from passing through said interface.

17. A method of fabricating a bipolar junction transistor ("BJT") to increase current gain, comprising the steps of:
providing a semiconductor substrate, said substrate comprising a base, an emitter, and a collector such that a carrier current conducts between said base and said emitter;
atomically cleaning an interface on said substrate at said emitter;
forming a silicon dioxide layer superjacent said semiconductor substrate; and
roughening said interface while patterning said silicon dioxide layer, thereby blocking a portion of said carrier current from passing through said interface.

18. The method of claim 17, wherein said roughening said interface comprises the steps of:
forming a layer of photoresist superjacent said silicon dioxide layer according to a pattern such that a remaining portion is exposed;
etching said remaining portion of said silicon dioxide layer, said etching disrupting said interface, thereby blocking a portion of said carrier current from passing through said interface; and
removing said photoresist from said silicon dioxide layer.

19. The method of claim 18, wherein said etching comprises a plasma dry etch, said plasma dry etch comprising the step of introducing a dry etch chemical, said dry etch chemical comprising at least one of $CCl_4$, $CF_4$, $NF_3$, $SF_6$, $Cl_2$, and $CCl_2F_2$.

20. A method of fabricating a bipolar junction transistor ("BJT"), comprising the steps of:
forming a semiconductor substrate having a base, an emitter and a collector to enable a carrier current to conduct between said base and said emitter, said substrate comprising an interface at said emitter;
forming a patterned silicon dioxide layer superjacent said semiconductor substrate, said patterned silicon dioxide layer exposing said interface;
forming a polysilicon layer superjacent a semiconductor substrate having a base, an emitter and a collector such that a carrier current conducts between said base and said emitter;
implanting said polysilicon layer with $O_2$; and
forming a silicon dioxide formation for obstructing said interface by heating said substrate, thereby blocking a portion of said carrier current from passing through said interface.

* * * * *